(12) United States Patent
Van Der Mast et al.

(10) Patent No.: US 10,796,879 B2
(45) Date of Patent: Oct. 6, 2020

(54) SCANNING ELECTRON MICROSCOPE

(71) Applicant: PHENOM-WORLD HOLDING B.V., Eindhoven (NL)

(72) Inventors: Karel Diederick Van Der Mast, Eindhoven (NL); Adrianus Franciscus Johannes Hammen, Eindhoven (NL); Wilhelmus Henrica Cornelis Theuws, Eindhoven (NL); Sander Richard Marie Stoks, Eindhoven (NL)

(73) Assignee: Phenom-World Holding B.V., Eindhoven (NL)

( * ) Notice: Subject to any disclaimer, the term of this patent is extended or adjusted under 35 U.S.C. 154(b) by 30 days.

(21) Appl. No.: 16/085,727

(22) PCT Filed: Mar. 3, 2017

(86) PCT No.: PCT/NL2017/050128
§ 371 (c)(1),
(2) Date: Sep. 17, 2018

(87) PCT Pub. No.: WO2017/150977
PCT Pub. Date: Sep. 8, 2017

(65) Prior Publication Data
US 2019/0103245 A1    Apr. 4, 2019

(30) Foreign Application Priority Data

Mar. 4, 2016   (NL) ..................... 2016367

(51) Int. Cl.
H01J 37/20   (2006.01)
H01J 37/18   (2006.01)
H01J 37/28   (2006.01)
H01J 37/14   (2006.01)
H01J 37/22   (2006.01)
H01J 37/244  (2006.01)

(52) U.S. Cl.
CPC ............ H01J 37/20 (2013.01); H01J 37/14 (2013.01); H01J 37/185 (2013.01); H01J 37/224 (2013.01); H01J 37/244 (2013.01); H01J 37/28 (2013.01); H01J 2237/184 (2013.01); H01J 2237/202 (2013.01); H01J 2237/204 (2013.01); H01J 2237/2006 (2013.01)

(58) Field of Classification Search
USPC ................... 250/442.11, 441.11, 440.11
See application file for complete search history.

(56) References Cited

U.S. PATENT DOCUMENTS

2012/0235036 A1* 9/2012 Hatakeyama ......... H01J 37/073
                                                    250/310

* cited by examiner

Primary Examiner — Kiet T Nguyen

(57) ABSTRACT

A scanning electron microscope (1) including a sliding vacuum seal (20) between an electron optical imaging system (2) and a sample carrier (10) with a first plate (22) having a first aperture (24) associated with the electron optical imaging system and resting against a second plate (26) having a second aperture (28) associated with the sample carrier. The first plate and/or the second plate includes a groove (40) circumscribing the first and/or second aperture. The scanning electron microscope may include a detector (8) movable relative to the electron beam. The scanning electron microscope may include a motion control unit for moving a sample carrier along a collision free path.

18 Claims, 11 Drawing Sheets

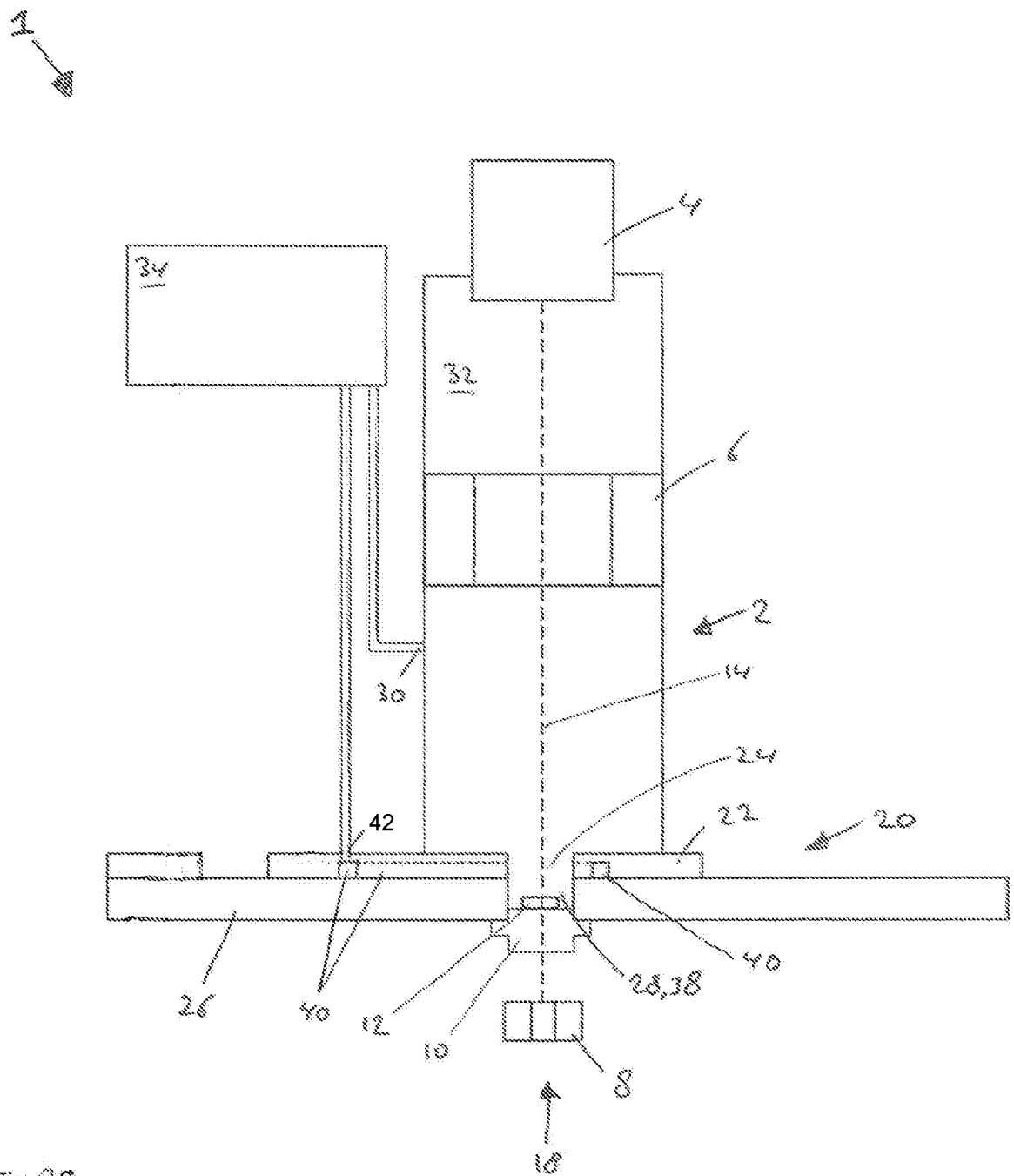

SCANNING ELECTRON MICROSCOPE

FIELD OF THE INVENTION

The present invention relates to the field of scanning electron microscopes.

BACKGROUND TO THE INVENTION

Scanning electron microscopes are known per se. The scanning electron microscope includes an electron optical imaging system. The electron optical imaging system can include an electron beam source and an electron detector. The electron beam source provides an electron beam which is focused onto a sample. The impinging electron beam causes secondary electrons to be emitted from the surface of the sample. Also some electrons from the electron beam are scattered in forward direction and backscattered. The electron detector detects the secondary, scattered and/or backscattered electrons and generates a signal representative of the amount of electrons detected. The electron beam is moved relative to the sample so as to scan the surface of the sample with the electron beam. The variation in the electron detector signal per location of the electron beam on the sample provides image information of the sample.

SUMMARY OF THE INVENTION

The invention relates to a scanning electron microscope.

It is an objective of the invention to provide an improved scanning electron microscope. It is also an objective of the invention to at least provide a useful alternative for known scanning electron microscopes.

According to a first aspect of the invention is provided a scanning electron microscope including an electron optical imaging system and a sample carrier, wherein the sample carrier is movable between a loading position for loading a sample and an imaging position for imaging the sample. The scanning electron microscope includes a sliding vacuum seal between the electron optical imaging system and the sample carrier. The sliding vacuum seal includes a first plate having a first aperture associated with the electron optical imaging system and resting against a second plate having a second aperture associated with the sample carrier. The first and second plates are slideably movable with respect to each other. The first and second apertures overlap in the imaging position. The first and second apertures do not overlap in the loading position. The first plate and/or the second plate includes a groove circumscribing the first and/or second aperture, wherein the groove is arranged for being in communication with a vacuum system.

It is noted that a scanning electron microscope having a sliding vacuum seal with a first plate having a first aperture associated with the electron optical imaging system and resting against a second plate having a second aperture associated with the sample carrier, the first and second plates being slideably movable with respect to each other, is known from US2011/133083A1. In the sliding vacuum seal of US2011/133083A1, however, the first plate and/or the second plate does not include a groove circumscribing the first and/or second aperture, wherein the groove is arranged for being in communication with a vacuum system.

The first plate and/or the second plate including a groove circumscribing the first and/or second aperture, wherein the groove is arranged for being in communication with a vacuum system, provides the advantage that a vacuum can be applied to the groove, hence, efficiently providing a suction force between the first and second plate. The suction force allows for a firm and/or mechanically stiff abutment of the first and second plates. Especially when the sample carrier is rigidly connected to the second plate, and the electron optical imaging system is rigidly connected to the first plate, the mechanically stiff abutment allows for rigid positioning of the sample with respect to the electron optical imaging system. Rigid positioning of the sample allows for high image quality.

Optionally, the vacuum system is arranged for having the electron optical imaging system and the sample carrier at a first vacuum level while imaging. The first vacuum level is preferably chosen such as to allow an electron beam of the electron optical imaging system to irradiate the sample, as is known in the art.

Optionally, the vacuum system is arranged for having the groove at a second vacuum level, different from the first vacuum level. Preferably the second vacuum level is between the first vacuum level and ambient pressure. Hence, the second vacuum level aids in maintaining a good vacuum seal between the first plate and the second plate. Moreover, having the groove at the second vacuum level between the first vacuum level and ambient pressure improves (e.g. allows to lower) the first vacuum level.

Optionally, the groove is arranged to circumscribe both the first and second apertures both in the loading position and in the imaging position. This provides the advantage that while moving the sample carrier from the loading position to the imaging position, the groove is not exposed to the first or second aperture. Hence, contamination of the groove can be avoided since it is not exposed. Further, it is possible to maintain the vacuum level inside the groove while moving the sample carrier from the loading position to the imaging position. The groove circumscribing the second aperture in the loading position, and/or at least a position not being the imaging position, also provides the advantage that the groove can be used as a pre-pump stage for the sample carrier. Providing a vacuum to the groove allows to pump the sample carrier from ambient pressure to (close to) the second vacuum level. It is noted that exposing the imaging system directly to a sample carrier at atmospheric pressure will damage the imaging system, while exposing the groove to a sample carrier at atmospheric pressure will not. After the sample carrier has been pre-pumped by the groove it will not damage the imaging system while moving to the imaging region.

According to a second aspect of the invention is provided a scanning electron microscope including an electron optical imaging system including an electron beam source and an electron detector, and a sample carrier between the electron beam source and the electron detector. The sample carrier is movable relative to the electron beam for moving a sample. The sample carrier can be movable e.g. in a plane orthogonal to the electron beam. The sample carrier can also be arranged such that a sample carried by the sample carrier is movable in a direction parallel to the electron beam. The electron detector is movable relative to the electron beam. The electron detector can be movable in a direction non-parallel to the electron beam, e.g. orthogonal to the electron beam.

The electron detector being movable relative to the electron beam provides the advantage that the scanning electron microscope is rendered more flexible in modes of detecting secondary and/or (back)scattered electrons.

Optionally, the electron detector is arranged for moving in synchronism with the sample, e.g. with the sample carrier. The electron detector can be arranged to move in the same direction as the sample carrier, e.g. simultaneously with the sample carrier. The electron detector can be arranged to move over the same distance as the sample carrier, e.g. simultaneously with the sample carrier. This provides the advantage that when the sample carrier is moved, for having the electron beam impinge on a different spot on the sample, the electron detector is also moved. The electron detector can be fixedly connected to the movable sample carrier.

Optionally, the scanning electron microscope includes a magnetic lens between the sample and the electron detector. Optionally, the scanning electron microscope includes a magnetic lens between the sample carrier and the electron detector. The magnetic lens can e.g. be electromagnetically driven and/or can include permanent magnets. The magnetic lens can be movable relative to the electron beam. The magnetic lens can be movable in a direction non-parallel to the electron beam, e.g. orthogonal to the electron beam.

Optionally, the magnetic lens is arranged for moving in synchronism with the sample, e.g. with the sample carrier. The magnetic lens can be arranged to move in the same direction as the sample carrier, e.g. simultaneously with the sample carrier. The magnetic lens can be arranged to move over the same distance as the sample carrier, e.g. simultaneously with the sample carrier. This provides the advantage that when the sample carrier is moved, for having the electron beam impinge on a different spot on the sample, the magnetic lens is also moved. The magnetic lens can be fixedly connected to the movable sample carrier.

Optionally, the electron detector is positioned in the focal plane of the magnetic lens. Optionally the electron detector is positioned in the focal point of the magnetic lens. Thus, when both the magnetic lens and the electron detector are moved in synchronism with the sample, the electron beam travelling through the sample is deflected by the magnetic lens towards the electron detector. It is noted that this allows for simple constructions, e.g. the magnetic lens and the electron detector being rigidly connected to the sample carrier, in which the position of the electron detector with respect to the sample is well defined. In case the sample is movable relative to an electron detector that is stationary relatively to the electron beam impinging on the sample, as in prior art scanning electron microscopes, it is harder to maintain mechanical stability and accuracy of the position of the inspected part of the sample relative to the electron detector.

Optionally, a bright-field area of the electron detector is positioned in the focal plane of the magnetic lens. Optionally, the bright-field area of the electron detector is positioned in the focal point of the magnetic lens. This provides the advantage that the primary electrons of the electron beam that are not disturbed by the sample are deflected to the bright-field area of the electron detector. Scattered electrons can then be deflected to the edges of the electron detector surrounding the bright-field area.

According to a third aspect of the invention is provided a scanning electron microscope including a vacuum chamber including internal structures, such as an electron optical system, and a sample carrier for carrying a sample, movable within the vacuum chamber. The scanning electron microscope includes a motion control unit including an input unit arranged for receiving user commands relating to movement of the sample carrier. The motion control unit includes a memory storing a three-dimensional model of the internal structures of the vacuum chamber. The three-dimensional model of the internal structures of the vacuum chamber can include a three-dimensional mode of the geometry of the internal structures of the vacuum chamber. The memory stores a three-dimensional model of the sample carrier. The three-dimensional model of the sample carrier can include a three-dimensional model of the geometry of the sample carrier. The motion control unit is arranged for moving the sample carrier on the basis of the received user commands and the three-dimensional models of the internal structures and the sample carrier while avoiding collision of the sample carrier and the internal structures.

Optionally, the memory further stores a three-dimensional model of the geometry of the sample carried on the sample carrier. The three-dimensional model of the sample can be a three-dimensional model of the geometry of the sample. The motion control unit can then be arranged for moving the sample carrier further on the basis of the three-dimensional model of the sample while avoiding collision of the sample, sample carrier and the internal structures.

Optionally, the motion control unit is arranged for determining a collision free path from the current location of the sample carrier to a target location of the sample carrier. Sample-based planning algorithms such as probabilistic roadmaps (PRMs) or rapidly-exploring random trees (RRTs), or rapidly-exploring dense trees, can be used to compute collision-free paths. However, other algorithms can be used. Optionally the collision-free path can be smoothed, e.g. to reduce jerk.

Optionally, the motion control unit is arranged for calculating a minimum distance between the three-dimensional models of on the one hand the sample carrier and optionally the sample, and on the other and the internal structures. The calculated minimum distance can be used for determining a collision free path.

Instead of avoiding collision of the sample carrier and the internal structures, or in addition thereto, the motion control unit can be arranged for moving the sample carrier on the basis of the received user commands and the three-dimensional models of the internal structures and the sample carrier and optionally the sample while maintaining distance between the sample carrier and internal structures, said distance being larger than or equal to a predetermined minimum distance. This allows for maintaining a predetermined safety distance. The predetermined minimum distance can be of special use when the internal structures are at a voltage different from the sample carrier, e.g. at a high (positive or negative) voltage. For example, the calculated minimum distance can be used for determining a path that maintains a distance of at least the predetermined minimum distance from internal structures at a voltage different from the sample carrier, e.g. at a high (positive or negative) voltage. Hence, electric discharge can be avoided.

Optionally, the motion control unit takes into account a first predetermined minimum distance and a different second predetermined minimum distance. The first minimum distance being maintained relative to internal structures of a first type and the second predetermined minimum distance being maintained relative to internal structures of a second type. The internal structures of the first type may e.g. be at a voltage different from the sample carrier (or differ by more than a threshold voltage), while the internal structures of the second type are at a substantially the same voltage as the sample carrier. The first predetermined minimum distance may then be larger than the second predetermined minimum distance.

Optionally, the motion control unit is arranged for simulating execution of a user command prior to executing the user command, wherein the motion control unit is arranged for ignoring the user command if the simulation indicates a collision of the sample carrier and/or the sample with the internal structures. Hence, any user command that would result in a collision can be ignored so as to avoid the collision. It will be appreciated that the motion control unit can be arranged for generating a message to the user that the user command will not be performed. The message can e.g. be displayed on a display device of the scanning electron microscope. Optionally, the motion control unit can determine an alternative route, alternative to the route according to the user command, resulting in positioning of the sample carrier and sample at the final position according to the user command, the alternative route being free of collision. The motion control unit can be arranged for suggesting the alternative route to the user, e.g. by displaying a message on the display device. The motion control unit can also be arranged for automatically substituting the alternative route for the route according to the user command.

Optionally, the input unit is arranged for receiving data representative of a geometry of the sample. It is for instance possible that the input unit is arranged for receiving measurements of the sample geometry. The motion control unit can be arranged for determining the three-dimensional model of the sample on the basis of the data representative of the geometry of the sample. The scanning electron microscope can include one or more templates for determining an approximate geometry of the sample. The templates can for example have a cavity of progressively increasing dimensions. The template with the smallest cavity that fits over the sample can be taken to be representative for the geometry of the sample. The cavity can e.g. be cylindrical or hemispherical, although other shapes can be envisaged.

Optionally, the scanning electron includes an optical camera and a geometry determination unit arranged for determining a geometry of the sample on the basis of at least one image of the sample provided by the optical camera. The optical camera can be arranged for providing a top plan image of the sample. The top plan image can be used for determining a perimeter of the sample. The geometry determination unit can be arranged for determining an outline of the sample by obtaining a first image and a second image wherein in the second image the sample is rotated over a first angle relative to its position in the first image, and determining pixels that are different in the first and second images. The differing pixels are representative for the perimeter of the sample. Alternatively, or additionally, the optical camera is arranged for providing a side view image of the sample. The geometry determination unit can be arranged for determining the three-dimensional model of the sample on the basis of two or more two-dimensional images of the sample. Optionally, the sample carrier includes one or more reference features, such as markers, appearing in the two-dimensional images for three-dimensional reconstruction of the model of the sample.

The invention also relates to a method for loading a sample into a vacuum chamber of a scanning electron microscope. The method includes providing a sample carrier that is movable between a loading position for loading the sample and an imaging position for imaging the sample. The scanning electron microscope includes a sliding vacuum seal between the electron optical imaging system and the sample carrier. The sliding vacuum seal includes a first plate having a first aperture associated with the electron optical imaging system and resting against a second plate having a second aperture associated with the sample carrier. The first and second plates are slideably movable with respect to each other. The first and second apertures overlap in the imaging position. The first and second apertures do not overlap in the loading position. The first plate and/or the second plate includes a groove circumscribing the first and/or second aperture. The groove is arranged for being in communication with a vacuum system. The method includes placing the sample in the sample carrier when the sample carrier is in the loading position. The method can also include applying a vacuum to the groove.

The invention also relates to a method for obtaining an electron microscope image of a sample including irradiating the sample with an electron beam from a first side, and using an electron detector detecting electrons transmitted through the sample at an opposite second side. The method includes moving the sample through the electron beam and moving the electron detector in synchronism with the sample.

Optionally, the method includes providing a magnetic lens between the sample and the electron detector and moving the magnetic lens in synchronism with the sample and the detector.

The invention also relates to a method for moving a sample within a vacuum chamber of a scanning electron microscope. The vacuum chamber includes internal structures, such as an electron optical imaging system. The method includes positioning the sample on a sample carrier that is movable within the vacuum chamber. The method includes inputting a user command relating to a desired movement of the sample into a motion control unit. The motion control unit includes a memory storing a three-dimensional model of the internal structures of the vacuum chamber and a three-dimensional model of the sample carrier. The method includes moving, by the motion control unit, the sample carrier on the basis of the received user commands and the three-dimensional models of the internal structures and the sample carrier while avoiding collision of the sample carrier and the internal structures.

Optionally, the memory further stores a three-dimensional model of the sample carried on the sample carrier. The method can include moving, by the motion control unit, the sample carrier further on the basis of the three-dimensional model of the sample while avoiding collision of the sample, sample carrier and the internal structures.

It will be appreciated that any of the aspects of the invention can be combined. It will also be clear that all features and options mentioned in view of the scanning electron microscope apply equally to the method.

It will be appreciated that any one or more of the above options can be combined.

BRIEF DESCRIPTION OF THE DRAWINGS

Embodiments of the present invention will now be described in detail with reference to the accompanying drawings in which:

FIG. 2C shows an example of a scanning electron microscope with a sample carrier in a third position;

DETAILED DESCRIPTION

Figure 1A:
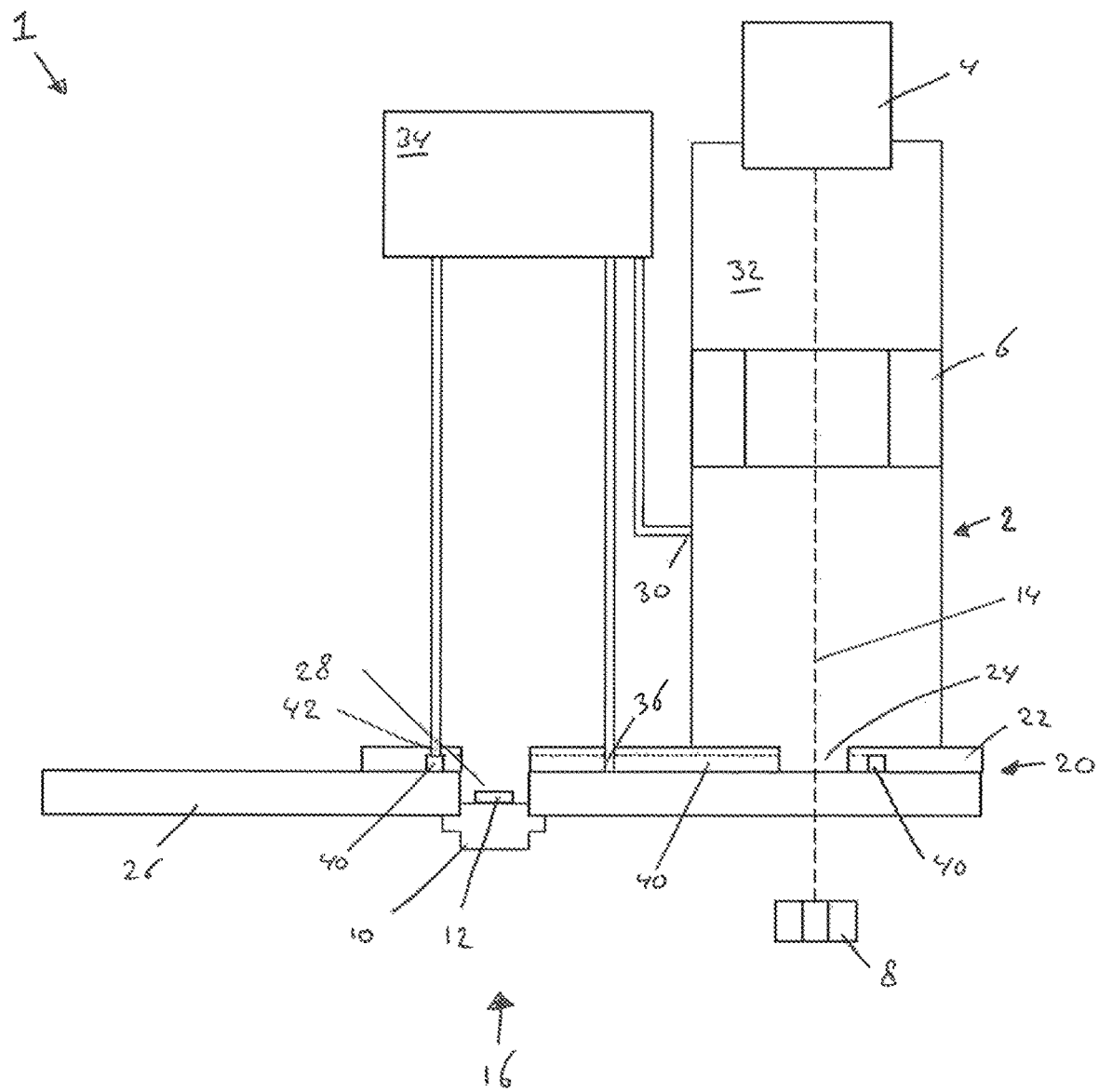
FIG. 1A shows an example of a scanning electron microscope with a sample carrier in a first position.
Figure 1B:
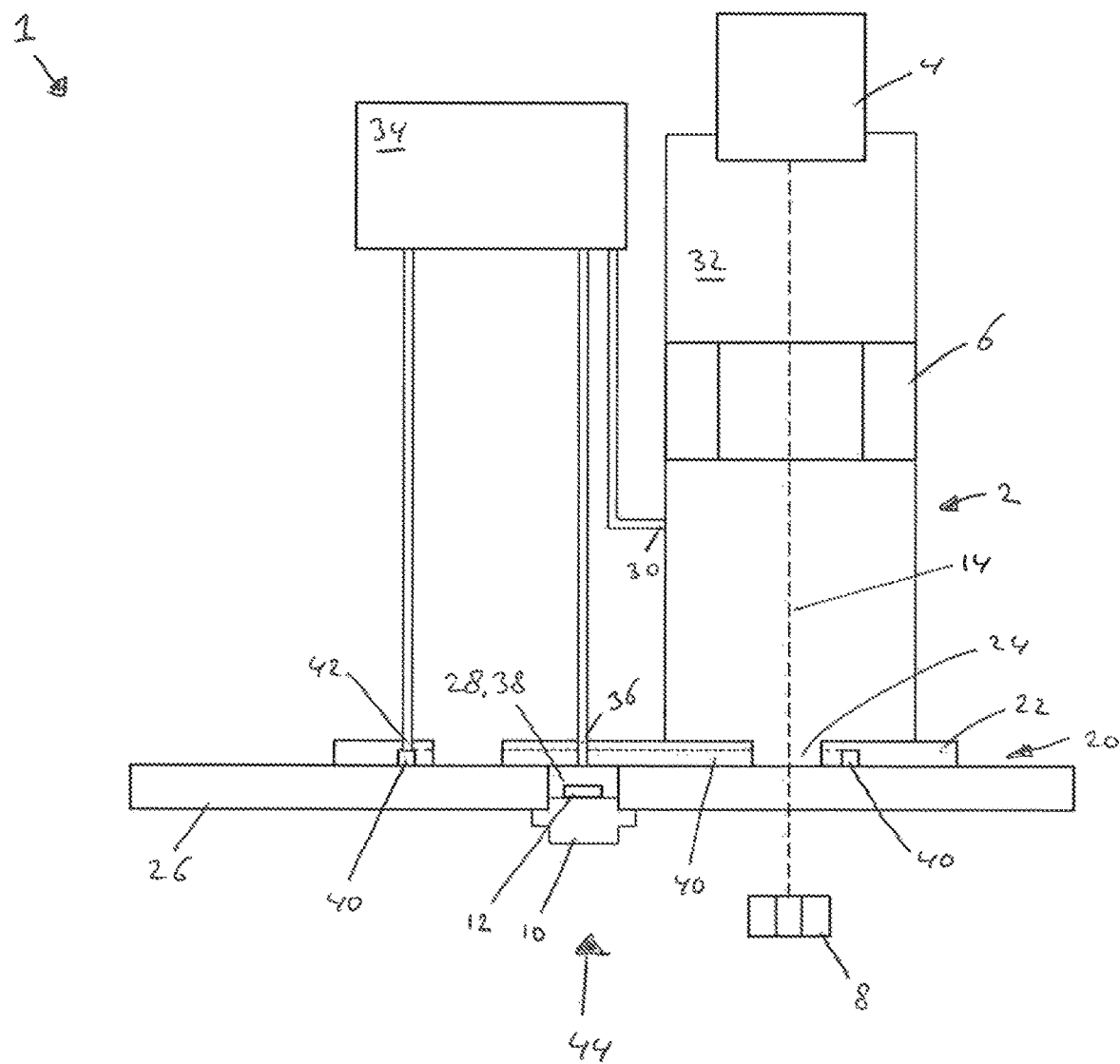
FIG. 1B shows an example of a scanning electron microscope with a sample carrier in a second position.
Figure 1C:
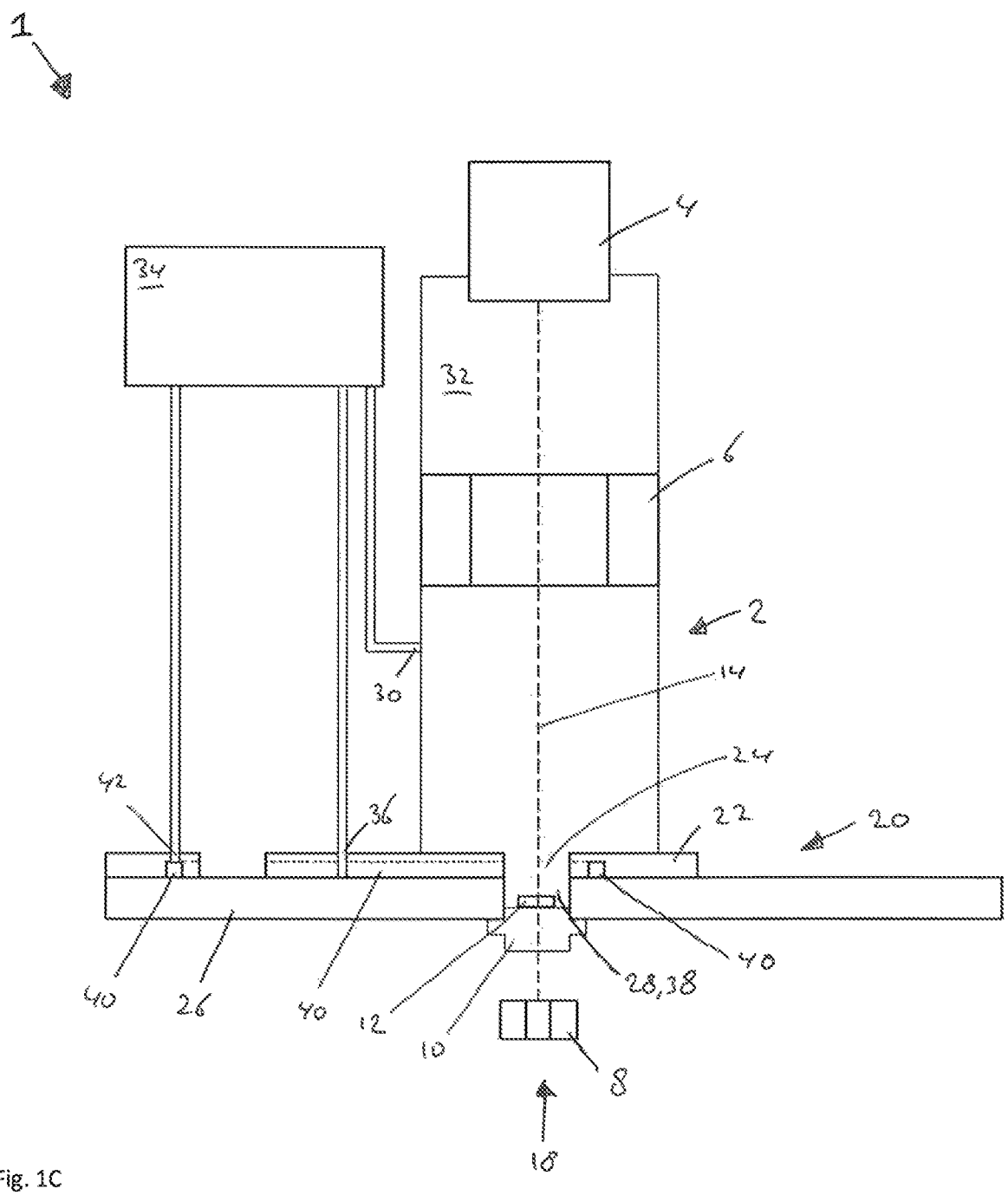
FIG. 1C shows an example of a scanning electron microscope with a sample carrier in a third position.

FIGS. 1A, 1B and 1C shows an example of a scanning electron microscope 1. The scanning electron microscope 1 includes an electron optical imaging system 2. In this example, the electron optical imaging system 2 includes an electron beam source 4 and a magnetic lens 6. The electron optical imaging system 2 includes an electron detector 8. The scanning electron microscope 1 includes a sample carrier 10. The sample carrier 10 is arranged for carrying a sample 12. The electron beam source 4 is arranged for generating an electron beam 14. The magnetic lens 6 focusses the electron beam 14 so as to impinge on the sample 12. Part of the electron beam 14 may pass the sample 12 undisturbed. Another part of the electron beam 14 has electrons scattered by the sample 12. The scattered electrons, and optionally the undisturbed electron beam 14, are detected by the electron detector 8. The sample carrier 10 is movable relative to the electron beam 14 for moving the sample 12 relative to the electron beam 14.

In the example of FIGS. 1A, 1B and 1C the sample carrier 10 is movable between a loading position 16 for loading a sample and an imaging position 18 for imaging the sample. The scanning electron microscope 1 includes a sliding vacuum seal 20 between the electron optical imaging system 2 and the sample carrier 10. In FIGS. 1A, 1B and 1C the sliding vacuum seal 20 includes a first plate 22 having a first aperture 24 associated with the electron optical imaging system 2. In FIG. 1 the sliding vacuum seal 20 includes a second plate 26 having a second aperture 28 associated with the sample carrier 10. The first plate 22 rests against the second plate 26. The second plate 26 is slideably movable with respect to the first plate 22. The contacting surfaces of the first and second plates 22, 26 are sufficiently smooth to act as vacuum seal.

When the sample carrier 10 is positioned in the imaging position 18 the first and second apertures 24, 28 overlap as shown in FIG. 1C. Hence the electron beam 14 can pass from the electron beam source 4 through the first and second apertures 24, 28 and impinge upon the sample 12. When the sample carrier 10 is positioned in the loading position 16 the first and second apertures 24, 28 do not overlap as shown in FIG. 1A. Hence the electron beam source 4 and a magnetic lens 6 are sealed from ambient air by the sliding vacuum seal 20. Thus, the electron beam source 4 and a magnetic lens 6 can be maintained at vacuum conditions. Thereto the scanning electron microscope 1 includes a first connector 30 connecting an inner space 32 of the electron optical system 2 to a vacuum system 34. The sample carrier 10 can in the loading position 16 be opened to ambient air for loading and/or unloading a sample 12 onto the sample carrier 10. It will be appreciated that after loading a sample 12 the sample carrier 10 can be closed and pumped to vacuum conditions as well. Thereto the scanning electron microscope 1 includes a second connector 36 connecting an inner space 38 of the sample carrier 10 to the vacuum system 34 as will be described below.

In the example of FIGS. 1A, 1B and 1C the first plate 22 includes a circumferential groove 40 circumscribing the first aperture 24. The groove 40 is in fluid communication with a third connector 42 connecting to the vacuum system 34. As can be seen in FIGS. 1A, 1B and 1C the groove 40 circumscribes both the first and second apertures 24, 28 both in the loading position 16 and in the imaging position 18. The groove 40 circumscribing both the first and second apertures 24, 28 both in the loading position and in the imaging position provides the advantage that the apertures 24, 28 do not cross the groove 40 during movement hence avoiding the risk of mechanical damage to the groove or the apertures. It will be appreciated that it is possible that the groove 40 circumscribes both the first and second apertures at least in the imaging position 18. The groove may circumscribe the first aperture 24, but not the second aperture 28, in the loading position.

It will be appreciated that alternatively, or additionally, the second plate 26 may include a circumferential groove circumscribing the second aperture 28. This groove too can be in fluid communication with a connector connecting to the vacuum system 34. This groove too can circumscribe both the first and second apertures 24, 28 both in the loading position 16 and in the imaging position 18.

The scanning electron microscope 1 described with respect to FIGS. 1A, 1B and 1C can be operated as follows.

The scanning electron microscope 1 is brought into a condition ready for operation. The sample carrier 10 is positioned in the loading position 16 for receiving a sample 12 as shown in FIG. 1A. The inner space 32 of the electron optical system 2 is brought at a predetermined first vacuum level by the vacuum system 34. The groove 40 is brought at a predetermined second vacuum level by the vacuum system 34. In this example, the second vacuum level is chosen to be different from the first vacuum level. Here the second vacuum level is chosen to be between the first vacuum level and ambient pressure.

With the sample carrier 10 in the loading position 16, a sample 12 is positioned in the sample carrier 10. The sample carrier 10 is closed from ambient air. In this example, the sample carrier 10 is closed by sliding the second plate 26 to an intermediate position 44 as shown in FIG. 1B. In the intermediate position 44 the sample carrier 10 is closed off by the first plate 22. In this example, in the intermediate position the inner spaced 38 of the sample carrier 10 is evacuated via the second connector 36. The inner space 38 of the sample carrier 10 in this example is brought at a vacuum level that is, at least approximately, equal to the first vacuum level in the inner space 32 of the electron optical system 2.

From the intermediate position 44 the sample carrier is moved to the imaging position 18 as shown in FIG. 1C. In the imaging position the first aperture 24 and the second aperture 28 overlap. As a result, the inner space 38 of the sample carrier 10 is in communication with the inner space 32 of the electron optical system 2. The electron beam source 4 and magnetic lens 6 are activated to generate the electron beam 14. The electron beam impinges on the sample 12. Both undisturbed electrons of the electron beam 14 and forward scattered electrons are detected by the electron detector 8. For providing an image of (a part of) the sample 12, the electron beam 14 is scanned across the surface of the sample 12. The scanned region of the sample 12 can be increased by tiling, i.e. scanning multiple portions of the sample 12 at different locations of the sample 12 relative to the electron beam 14. In this example the sample 12 is scanned in a plane orthogonal to the electron beam 14 by moving the sample carrier, and the second plate 26, along the first plate 22. The sample 12 can be scanned in two orthogonal directions.

The groove 40 being maintained at a second vacuum level provides a suction force clamping the first and second plates 22, 26 together. Hence a rigid connection can be obtained of the sample carrier 10 with respect to the electron optical imaging system 2. This provides a good spatial stability of the sample 12 with respect to the electron beam 14. It is noted that the suction force may cause stick-slip effects when moving the second plate 26 relative to the first plate 22. In an embodiment the sample carrier 10 is controlled to always approach a target location from the same direction, so as to avoid hysteresis effects in positioning. For example when moving in a plane orthogonal to the electron beam 14 in two orthogonal directions, X and Y, the sample carrier 10 may be controlled to always approach a target location in the positive X direction and in the positive Y direction.

Figure 2A:
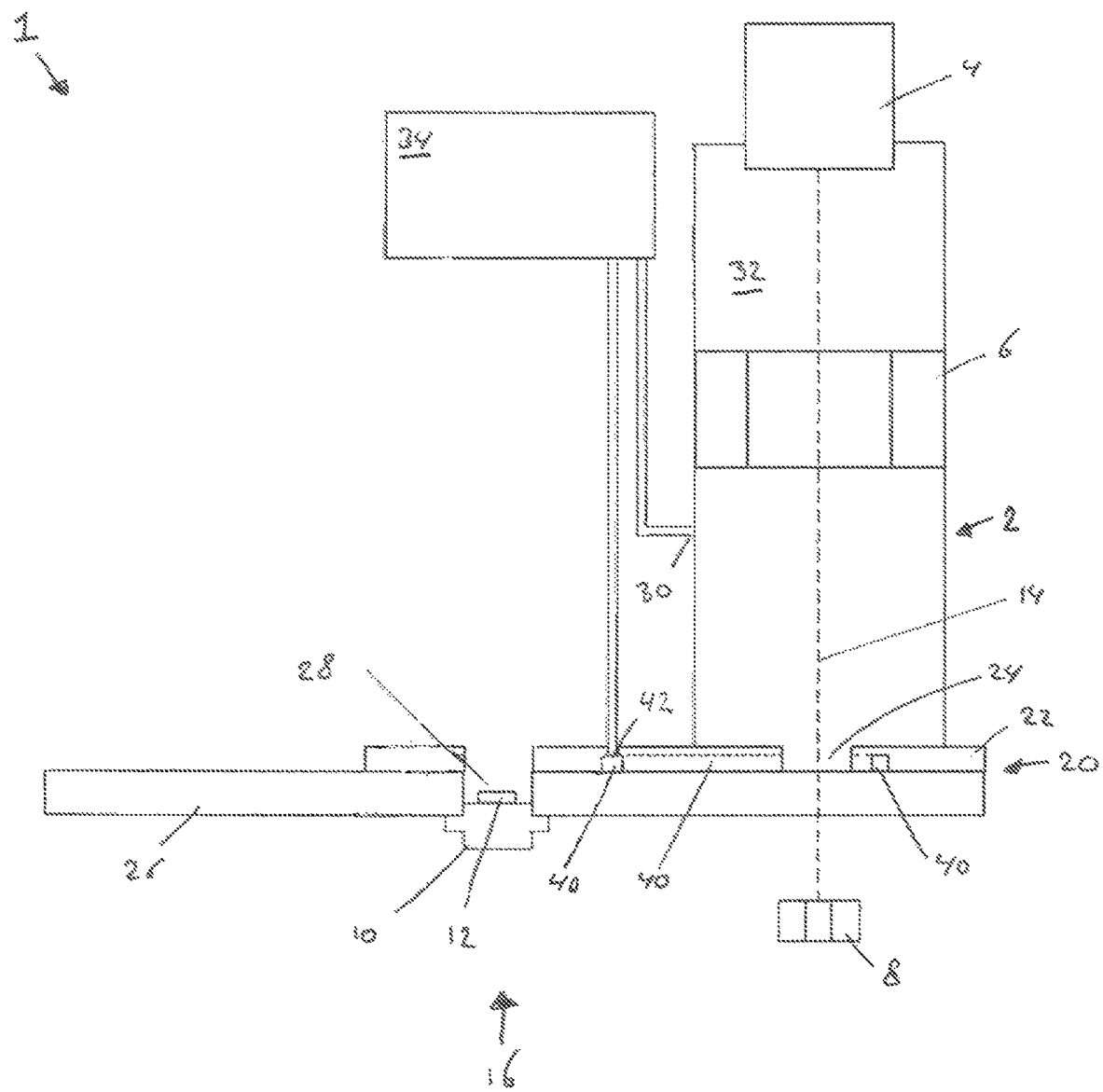
FIG. 2A shows an example of a scanning electron microscope with a sample carrier in a first position.
Figure 2B:
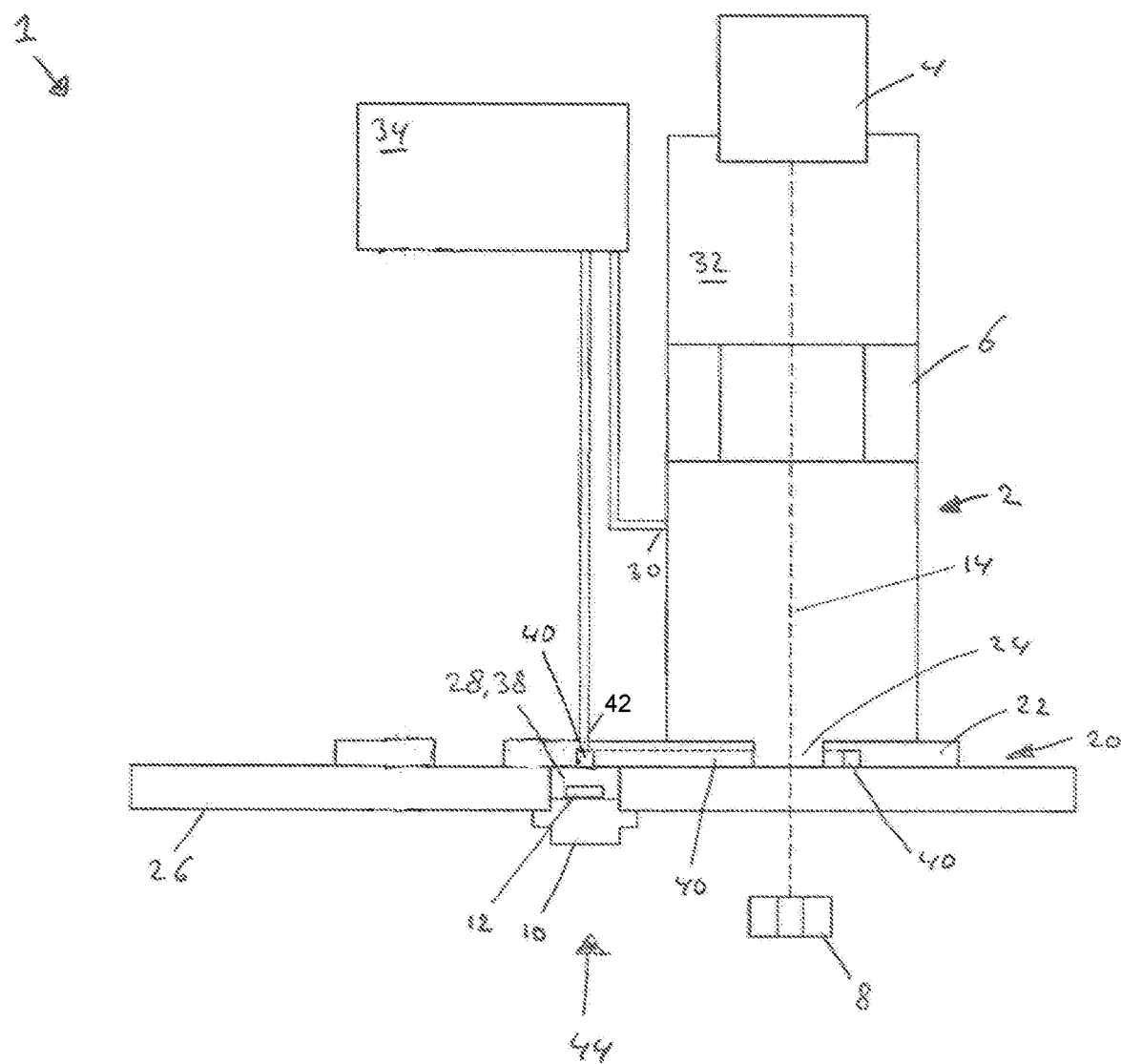
FIG. 2B shows an example of a scanning electron microscope with a sample carrier in a second position.

FIGS. 2A, 2B and 2C show an example of a scanning electron microscope 1 similar to the example shown in FIGS. 1A, 1B and 1C. Like reference numerals refer to like features. In the example of FIGS. 2A, 2B and 2C, the groove 40 extends around the first aperture 24. In this example the groove 40 extends around the first aperture 24 and second aperture 28 in the imaging position 18. In this example the groove 40 extends around the first aperture 24 but not around the second aperture 28 in the loading position 16.

It is noted that the second connector 36 is not necessary in this example. Instead, in the intermediate position 44, as shown in FIG. 2B, the inner space 38 of the sample carrier 10 can be evacuated via the third connector 42.

Figure 3A:
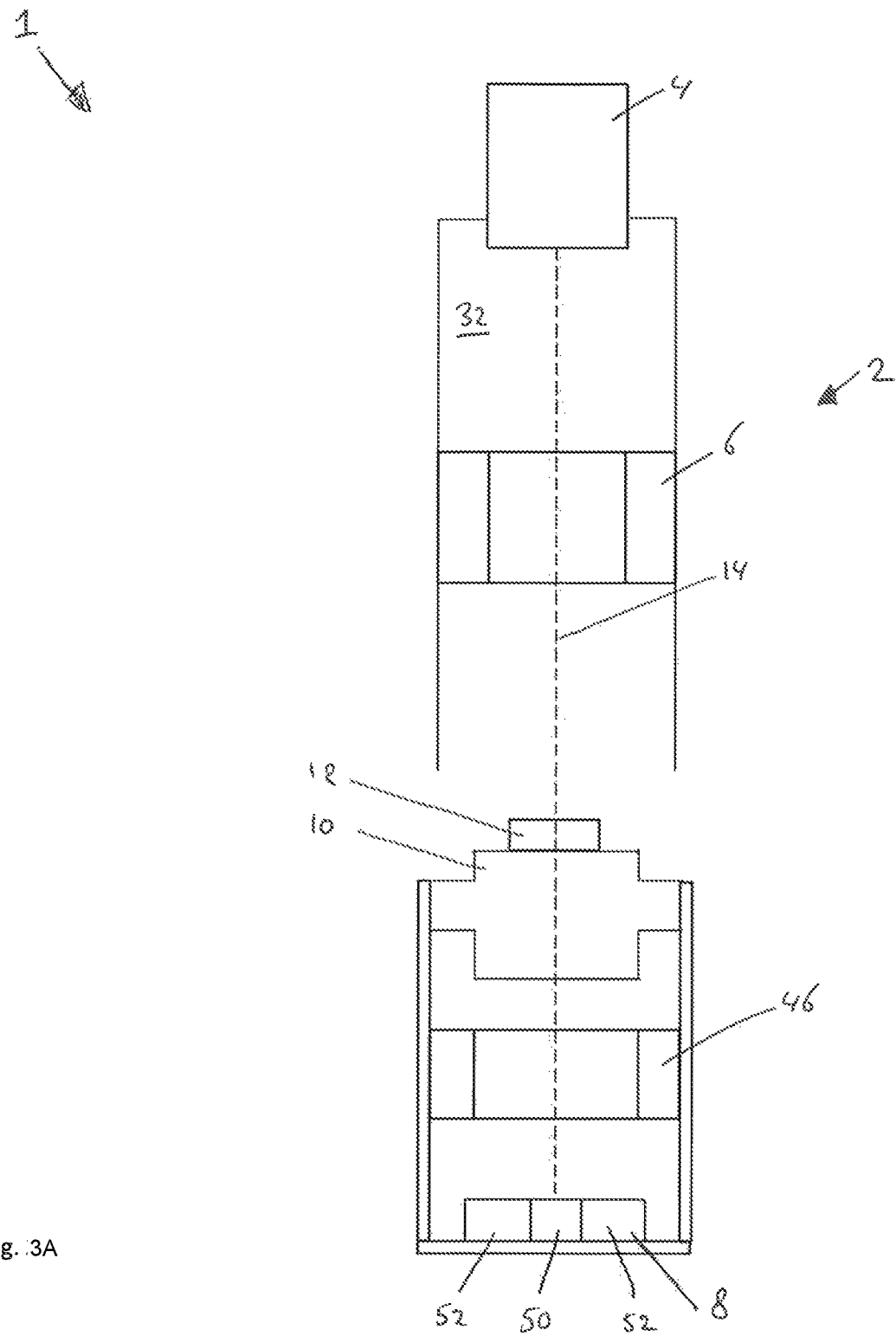
FIG. 3A shows an example of a scanning electron microscope with a sample carrier in a first position.
Figure 3B:
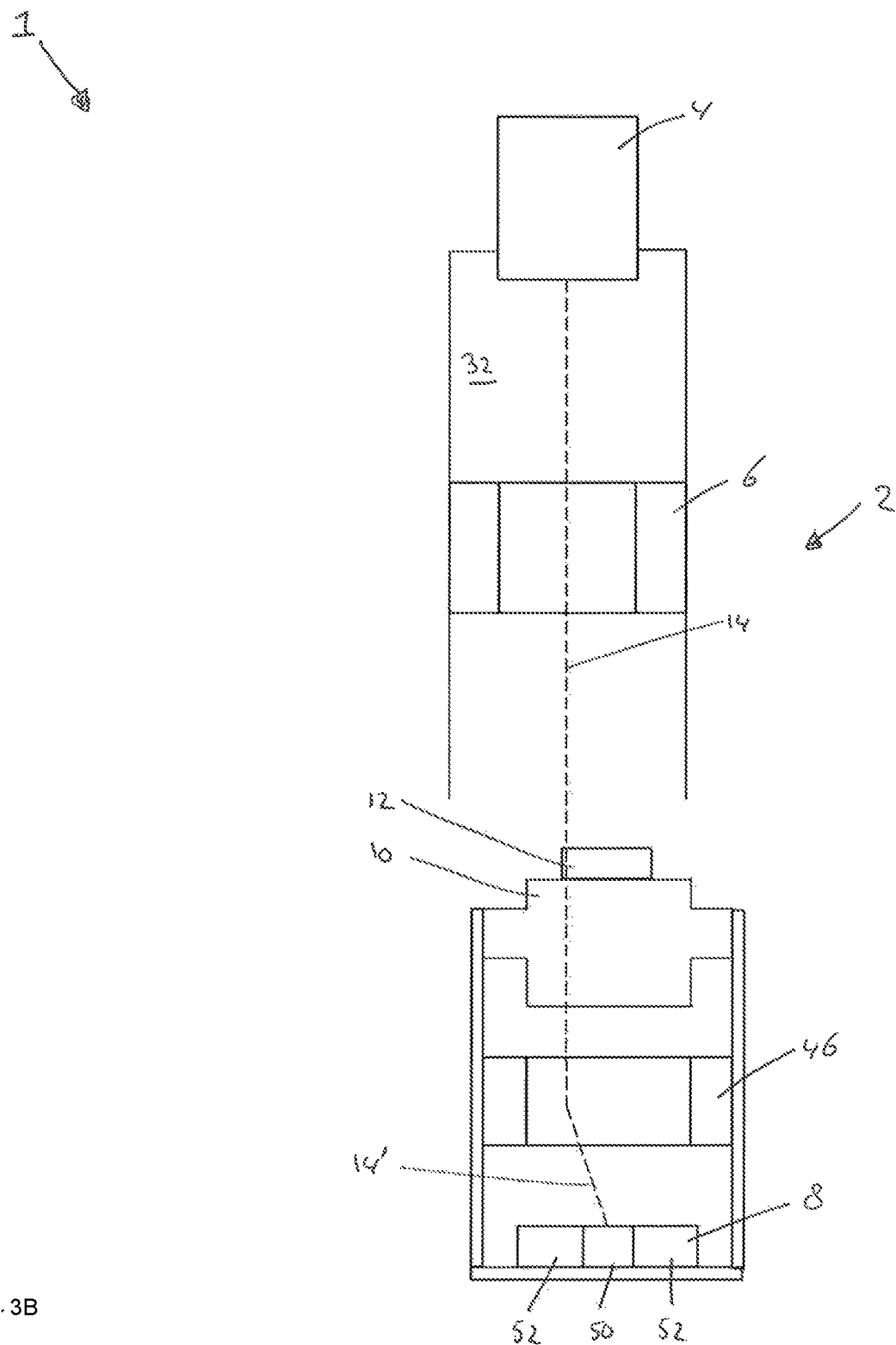
FIG. 3B shows an example of a scanning electron microscope with a sample carrier in a second position.

FIGS. 3A and 3B show an example of a scanning electron microscope 1. Similarly as described with respect to FIGS. 1A, 1B, 1C, 2A, 2B and 2C the scanning electron microscope 1 includes an electron optical imaging system 2. In this example, the electron optical imaging system 2 includes an electron beam source 4 and a magnetic lens 6. The electron optical imaging system 2 includes an electron detector 8. The scanning electron microscope 1 includes a sample carrier 10. The sample carrier 10 is arranged for carrying a sample 12. The electron beam source 4 is arranged for generating an electron beam 14. The magnetic lens 6 focusses the electron beam 14 so as to impinge on the sample 12. Part of the electron beam 14 may pass the sample 12 undisturbed. Electrons of another part of the electron beam 14 are scattered by the sample 12. The forward scattered electrons, and optionally the undisturbed electron beam 14, are detected by the electron detector 8. The sample carrier 10 is movable relative to the electron beam 14 for moving the sample 12 relative to the electron beam 14.

In the example of FIGS. 3A and 3B the scanning electron microscope 1 includes a second magnetic lens 46. The second magnetic lens 46 is positioned between the sample 12 and the electron detector 8. The electron detector 8 is positioned in the focal plane of the second magnetic lens 46. In this example the second magnetic lens 46 is rigidly connected to the sample carrier 10. Hence, the position of the second magnetic lens 46 with respect to the sample 12 is well defined. In this example the electron detector 8 is rigidly connected to the sample carrier 10. Hence, the position of the electron detector 8 with respect to the sample 12 is well defined.

The sample carrier 10 is movable relative to the electron beam 14. In this example, the sample carrier is movable in a plane orthogonal to the electron beam. The sample carrier 10 can e.g. be the movable part of a sample stage. The sample carrier can also be movable as explained with respect to FIGS. 1A, 1B and 1C or FIGS. 2A, 2B and 2C. Since the second magnetic lens 46 is rigidly connected to the sample carrier, the second magnetic lens 46 moves in synchronism with the sample carrier 10. Since the electron detector 8 is rigidly connected to the sample carrier, the electron detector moves in synchronism with the sample carrier 10. Since the electron detector 8 is positioned in the focal point of the second magnetic lens 46, the electron beam 14' travelling through the sample 12 will be deviated by the second magnetic lens 46 towards the focal point, i.e. towards the electron detector 8. This can for instance be seen in FIG. 2B.

In the example of FIGS. 3A and 3B the electron detector 8 includes a central bright-field area 50 and a dark-field area 52 surrounding the bright-field area. The bright-field area 50 of the electron detector 8 is positioned in the focal plane of the second magnetic lens 46. Hence the undisturbed electron beam 14' is deviated towards the bright-field area 50. The forward scattered electrons are deviated towards the dark-field area 52.

Figure 4A:
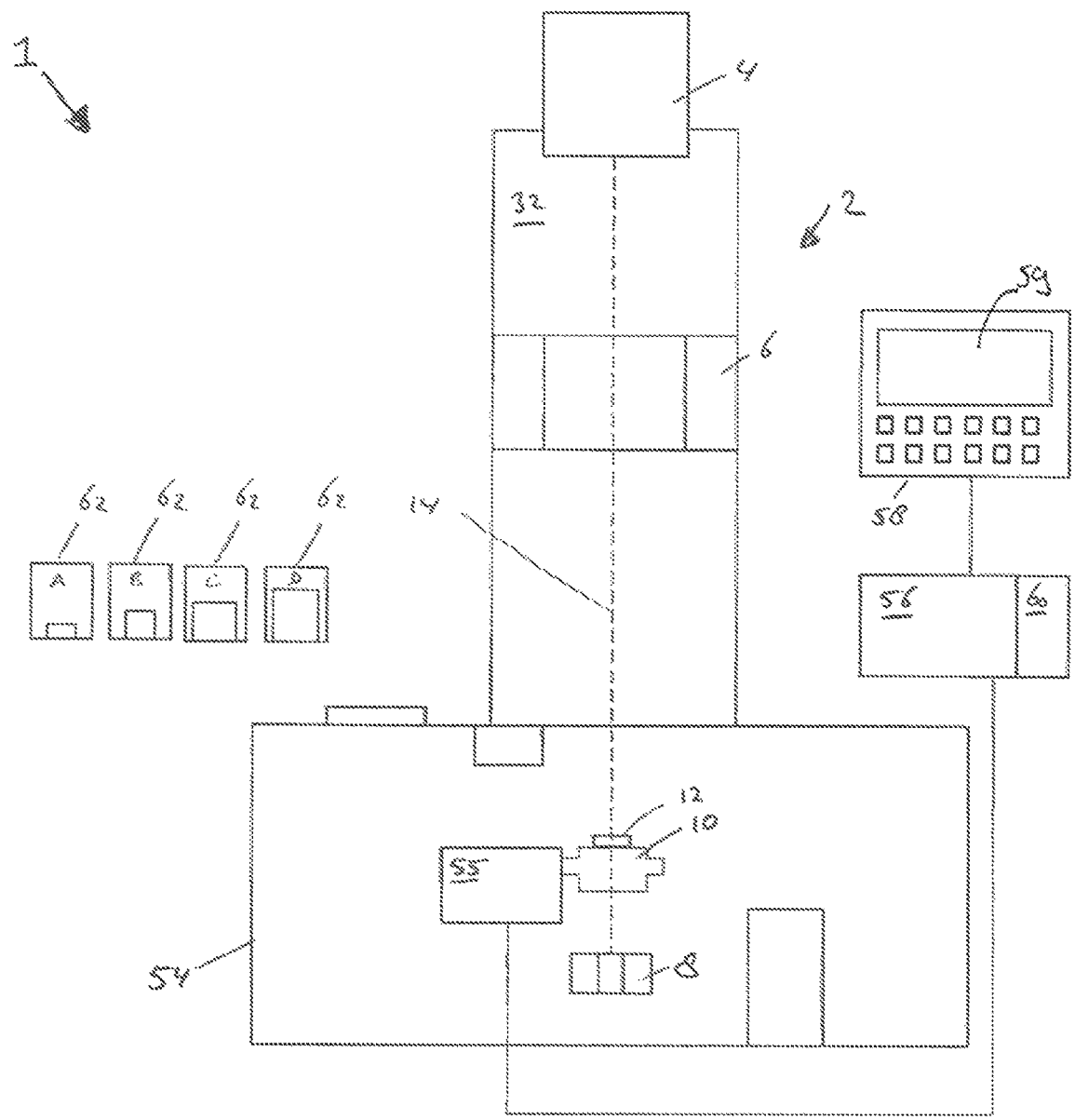
FIG. 4A shows an example of a scanning electron microscope.
Figure 4B:
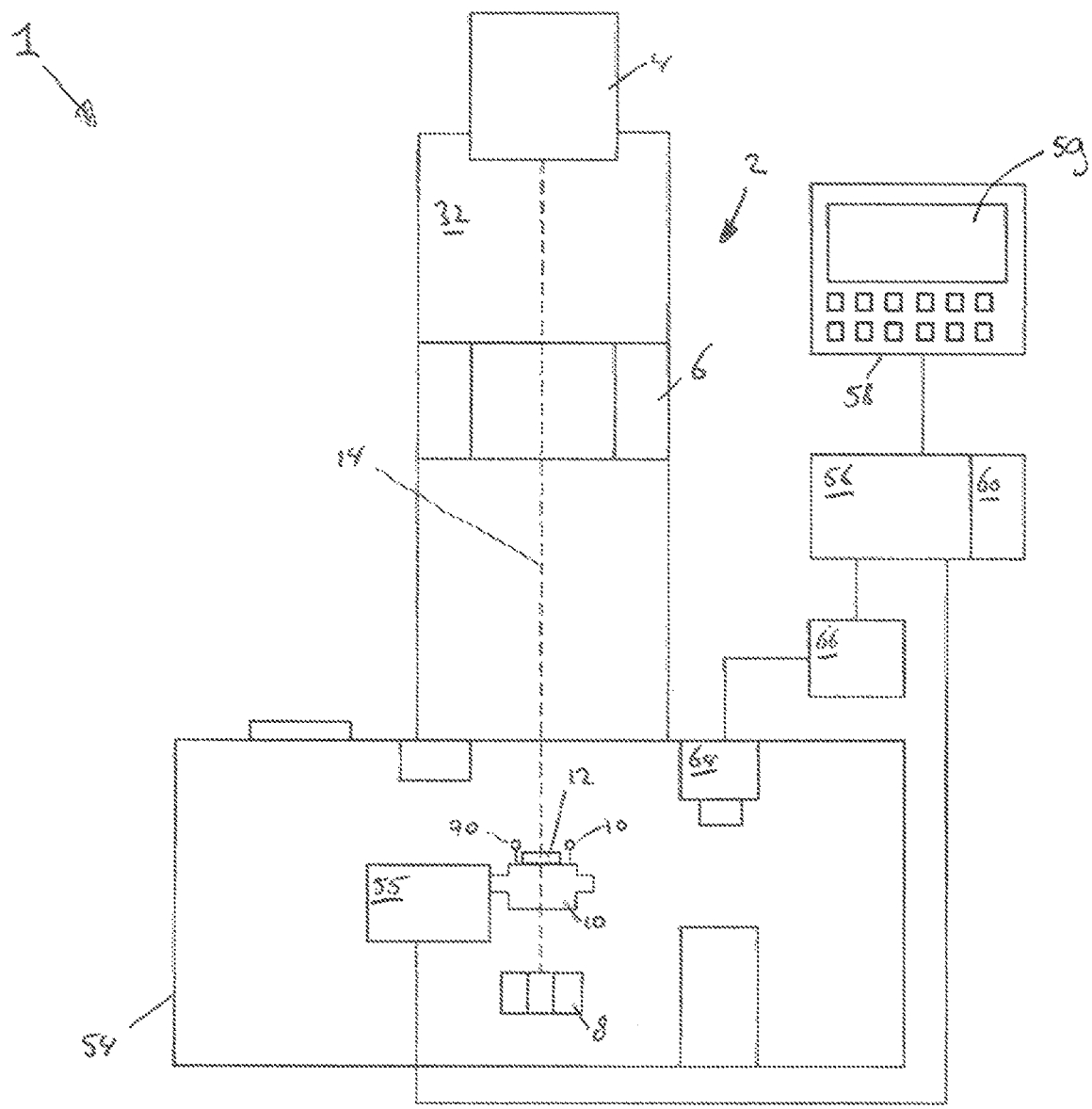
FIG. 4B shows an example of a scanning electron microscope.
Figure 4C:
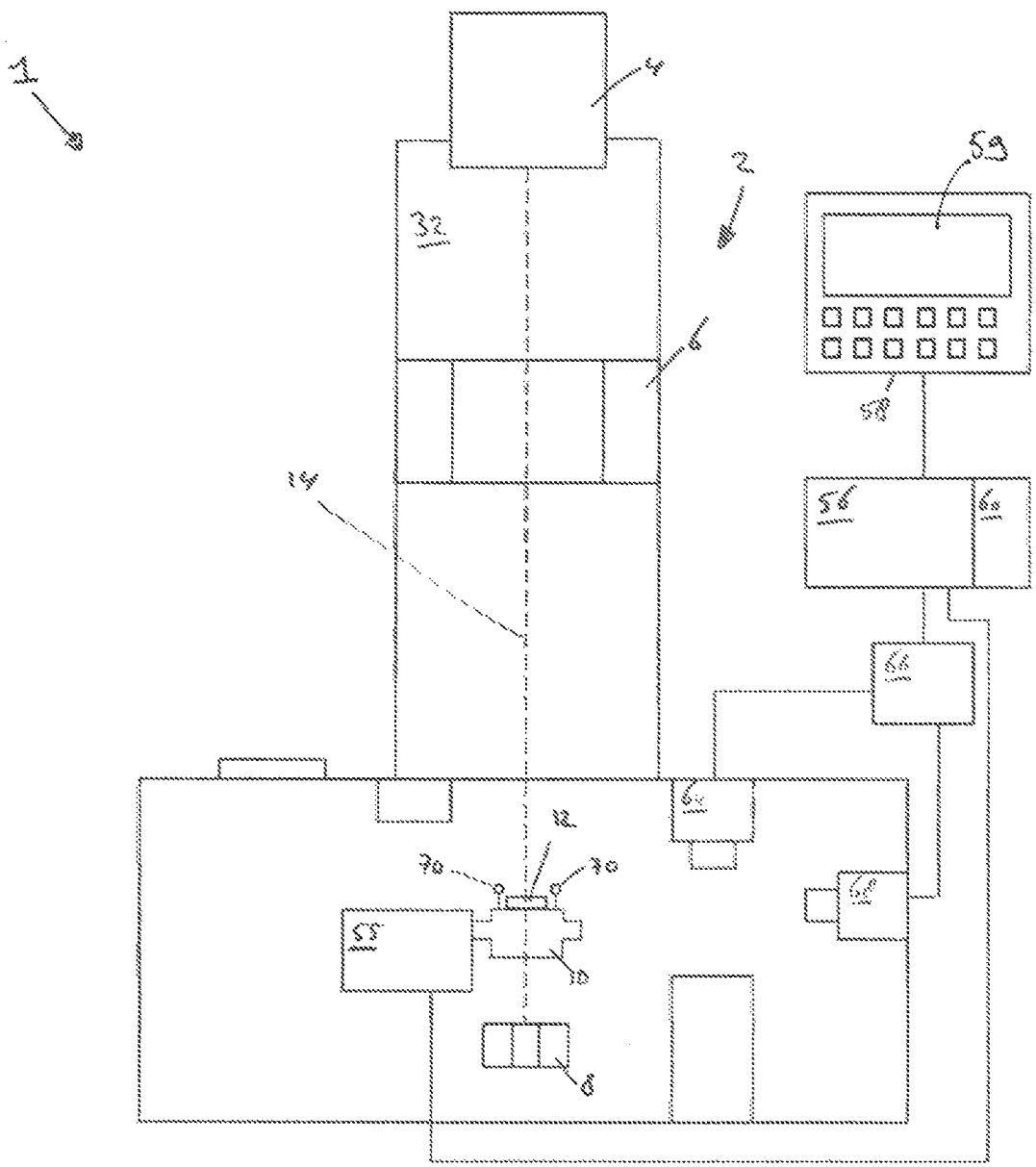
FIG. 4C shows an example of a scanning electron microscope.

FIGS. 4A, 4B and 4C show an example of a scanning electron microscope 1. Similarly as described with respect to FIGS. 1A, 1B, 1C, 2A, 2B, 2C, 3A and 3B the scanning electron microscope 1 includes an electron optical imaging system 2. In this example, the electron optical imaging system 2 includes an electron beam source 4 and a magnetic lens 6. The electron optical imaging system 2 includes an electron detector 8. The scanning electron microscope 1 includes a sample carrier 10. The sample carrier 10 is arranged for carrying a sample 12. The electron beam source 4 is arranged for generating an electron beam 14. The magnetic lens 6 focusses the electron beam 14 so as to impinge on the sample 12. Part of the electron beam 14 may pass the sample 12 undisturbed. Electrons of another part of the electron beam 14 is scattered by the sample 12. The forward scattered electrons, and optionally the undisturbed electron beam 14, are detected by the electron detector 8. However, also other detectors may be present, e.g. a back-scattered electron detector (BSD), a secondary electron detector (SE), an energy dispersive X-ray detector (EDX), a detector for sample current, a cathodoluminescence detector (CL), an Auger detector, an optical camera, etc. The sample carrier 10 is movable relative to the electron beam 14 for moving the sample 12 relative to the electron beam 14.

The scanning electron microscope 1 includes a vacuum chamber 54. The vacuum chamber 54 includes internal structures, such as the electron optical imaging system 2. The sample carrier 10 is movable within the vacuum chamber 54. A movement system 55 is provided for moving the sample carrier 10. The movement system 55 may include guides and actuators as is known in the art. The movement system may be arranged for moving the sample carrier along one or more axes and/or for rotating the sample carrier about one or more axes. The movement system may be arranged for moving the sample carrier in six degrees of freedom. The movement system 55 may be arranged for moving the sample carrier in two directions in a plane orthogonal to the electron beam 14. The movement system 55 may be arranged for moving the sample carrier 10 in a direction parallel to the electron beam. The movement system may be arranged for tilting the sample carrier in one or two directions relative to the electron beam. The movement system may be arranged for rotating the sample about an axis that is parallel to the electron beam.

The scanning electron microscope includes a motion control unit 56. The motion control unit 56 is arranged for controlling the movement system 55 for moving the sample carrier 10. The motion control unit 56 includes an input unit 58 arranged for receiving user commands relating to movement of the sample carrier 10. The input unit 58 can include a keyboard, a pointing device, a touchscreen, a voice activated unit or the like. The motion control unit 56 includes a memory 60. In this example, the memory 60 stores a three-dimensional model of the internal structures of the vacuum chamber 54. The three-dimensional model of the internal structures can include a three dimensional model of a geometry of the internal structures of the vacuum chamber 54. The three-dimensional model of the internal structures can also include a three dimensional model of inner walls of the vacuum chamber 54. In this example the memory 60 further stores a three-dimensional model of the sample carrier 10. The three-dimensional model of the sample carrier can include a three dimensional model of a geometry of the sample carrier 10.

The scanning electron microscope 1 as described with respect to FIGS. 4A, 4B and 4C can be operated as follows.

The sample carrier 10 carrying the sample 12 is positioned inside the vacuum chamber 54 at a first position. The electron beam 14 can impinge on the sample 12. The user can input a user command related to a desired movement of the sample carrier 10 into the input unit 58. In this example, the user command relates to an absolute position, e.g. coordinates, of a desired second location of the sample carrier 10. It is also possible that the user command relates to a relative position of a desired second location of the sample carrier 10 e.g. a desired displacement—e.g. 0.125 mm in a predetermined direction—of the sample carrier 10. Based on the current location of the sample carrier 10 at the first position and the desired location of the sample carrier 10 at the second location the motion control unit 56 calculates a path to be followed by the sample carrier from the first position to the second position. In calculating the path the motion control unit 56 uses the three-dimensional model of the internal structures and the three-dimensional model of the sample carrier 10 for calculating a path that is free of collision of the sample carrier 10 and the internal structures. In this example, the motion control unit 56 uses a sample-based planning. The sample-based planning algorithm can e.g. be a probabilistic roadmap (PRM), or rapidly-exploring random tree (RRT), or rapidly-exploring dense tree. However, other algorithms can be used. Optionally the collision-free path can be smoothed, e.g. to reduce jerk of the sample carrier 10. Once the collision free path has been determined, the motion control unit 56 controls the movement system 55 for moving the sample carrier 10 along the collision free path.

It is noted that in determining a possible path a collision can be determined if on at least one position along the path the three-dimensional model of the sample carrier touches or intersects the three-dimensional model of the internal structures. It will be appreciated that also a safety margin may be used, wherein collision is taken as a distance less than a predetermined safety distance. In that case the motion control unit determines the path to include a collision if on at least one position along the path the minimum distance between the three-dimensional model of the sample carrier 10 and the three-dimensional model of the internal structures is less than the predetermined safety distance.

It will be appreciated that the movement system 55 be embodied as a sample stage. Alternatively, the sample carrier 10 can be a movable part of a sample stage. Various parts of the sample stage can move at different rates or strokes when the sample carrier 10 is moved. It will be appreciated that the memory can also store a three-dimensional model of the sample stage. In calculating the path the motion control unit 56 can also use the three-dimensional model of the sample stage for calculating a path that is free of collision of the sample stage and the internal structures. More in general, in calculating the path the motion control unit 56 can also use a three-dimensional model of the movement system for calculating a path that is free of collision of the sample carrier, the movement system, and the internal structures.

In a mode the memory 60 further stores a three-dimensional model of the sample 12 carried on the sample carrier 10. The three-dimensional model of the sample can include a three dimensional model of a geometry of the sample 12. The motion control unit 56 can use the three-dimensional model of the sample 12 in calculating path to be followed by the sample carrier 10 from the first position to the second position so as to avoid collision of the sample 12, sample carrier 10, optionally the movement system 55, and the internal structures.

The motion control unit 56 controls the sample carrier 10 to move from the first position to the second position along the calculated path that is free of collision.

The motion control unit 56 in this example is arranged for simulating execution of a user command prior to executing the user command. The simulation includes calculating a path from the current position of the sample carrier 10 to an updated position according to the user command. If the path calculated in the simulation indicates a collision between the sample carrier 10 (and optionally the sample 12 and/or the movement system 55) on the one hand and the internal structures on the other hand, the motion control unit refrains from performing the user command. Thus, the motion control 56 unit is arranged for ignoring the user command if the simulation indicates a collision. This prevents collisions or collision hazards in case the safety margin is observed. The motion control unit 56 can be arranged for generating a message to the user that the user command cannot, should not, or will not be performed. The message can e.g. be displayed on a display device 59 of the scanning electron microscope. The motion control unit 56 can be arranged for determining an alternative route, alternative to a route according to the user command, resulting in positioning of the sample carrier 10 at the final position according to the user command, the alternative route being free of collision. The motion control unit 56 can be arranged for suggesting the alternative route to the user, e.g. by displaying a message on the display device 59. The motion control unit 56 can also be arranged for automatically substituting the alternative route for the route according to the user command. The motion control unit 56 may generate a message indicating use of an alternate route. The motion control unit 56 may be arranged for indicating the alternative route at the display device 59, e.g. in overlay with a microscope image.

In the example of FIGS. 4A, 4B and 4C the input unit 58 is arranged for receiving data representative of a geometry of the sample 12. It is possible that the geometry of the sample is known. Then the data can include a three-dimensional model of the geometry of the sample. Alternatively, the data representative of the geometry of the sample can be indicative of the geometry of the sample.

In the example of FIG. 4A the scanning electron microscope 1 includes a plurality of templates 62 for determining an approximate geometry of the sample 12. In this example each template includes a cavity of predetermined dimensions. Here the cavities are cylinders of different diameter and/or height. However, alternate shapes can be used, such as hemispheres, lozenges, cubes, cones, or the like. The user can fit one or more of the templates 62 over the sample 12 on the sample carrier 10 to select the template 62 having the smallest cavity fitting over the sample 12. An indication of the selected template 62, e.g. a code or number, can be provided to the input unit 58. From this, the scanning electron microscope 1 can determine an approximated geometry of the sample 12.

In the example of FIG. 4B the scanning electron microscope 1 includes an optical camera 64 and a geometry determination unit 66. The geometry determining unit 66 is arranged for determining a geometry of the sample 12 on the basis of at least one image of the sample 12 provided by the optical camera 64. The optical camera 64 is positioned for providing a top plan image of the sample 12.

Here the geometry determination unit 66 determines a perimeter of the sample 12. The optical camera 64 obtains a first image of the sample 12 in top plan view. Next, the sample is rotated over a predetermined angle about an axis substantially parallel to the optical axis of the camera 64. Then the optical camera 64 obtains a second image of the sample 12 in top plan view. The geometry determination unit 66 compares the first image with the second image. In this example the geometry determination unit compares an intensity of each pixel in the first image with an intensity of the corresponding pixel in the second image. Pixels for which the difference of the intensity in the first and second images exceeds a predetermined threshold level are determined to be indicative of the outline of the sample 12. The geometry determination unit 66 determines an approximate geometry of the sample on the basis of the determined outline. It will be appreciated that a height of the sample may be determined as a predetermined height, or as a function of a dimension of the outline, e.g. a predetermined percentage of a maximum diameter of the top plan outline of the sample.

In the example of FIG. 4C an optical camera 68 is arranged for providing a side view image of the sample 12. The optical camera 68 obtains a first image of the sample 12 in side view. Next, the sample is rotated over a predetermined angle about an axis substantially orthogonal to the optical axis of the camera 68. Then the optical camera 68 obtains a second image of the sample 12 in side view. The geometry determination unit 66 determines the three-dimensional model of the sample 12 on the basis of the first image and the second image. Optionally, the optical camera 68 may obtain further images of the sample at different rotational positions for the geometry determination unit 66 to use. The geometry determination unit 66 can use techniques for reconstructing a three-dimensional model on the basis of two or more two-dimensional images known in the art. In the example of FIG. 4C the sample carrier 10 includes markers 70. The markers 70 are positioned to be in the field of view of the optical camera 68. Hence, the markers 70 appear in the two-dimensional images obtained by the camera 68. The markers can be used in three-dimensional reconstruction of the model of the sample from the two-dimensional images.

It will be appreciated that the camera 68 of FIG. 4C can also be combined with the camera 64 of FIG. 4B. Camera 64 can then provide information on the outline of the sample 12, while the camera 68 can provide information on the height of the sample.

Herein, the invention is described with reference to specific examples of embodiments of the invention. It will, however, be evident that various modifications and changes may be made therein, without departing from the essence of the invention. For the purpose of clarity and a concise description features are described herein as part of the same or separate embodiments, however, alternative embodiments having combinations of all or some of the features described in these separate embodiments are also envisaged.

It will be appreciated that the scanning electron microscope as described with respect to FIGS. 3A, 3B, 4A, 4B and 4C may also include a slicing vacuum seal, e.g. as described with respect to FIGS. 1A, 1B, 1C, 2A, 2B and 2C.

It will be appreciated that the scanning electron microscope as described with respect to FIGS. 1A, 1B, 1C, 2A, 2B, 2C, 4A, 4B and 4C may also include a second magnetic lens and/or electron detector movable in synchronism with the sample carrier, e.g. as described with respect to FIGS. 3A and 3B

It will be appreciated that the scanning electron microscope as described with respect to FIGS. 1A, 1B, 1C, 2A, 2B, 2C, 3A and 3B may also include a motion control unit, e.g. as described with respect to FIGS. 4A, 4B and 4C.

In the example of FIGS. 4A, 4B and 4C, the motion control unit is arranged for avoiding collision. It will be appreciated that it is also possible that the motion control unit is arranged for maintaining a distance between the sample carrier and internal structures, said distance being larger than or equal to a predetermined minimum distance. This can provide for a predetermined safety margin. Fore example, the calculated minimum distance can be used for determining a path that maintains a distance of at least the predetermined minimum distance from internal structures at a voltage different from the sample carrier, e.g. at a high (positive or negative) voltage. Hence, electric discharge between the sample carrier and/or sample and the respective internal structure can be avoided.

It will be appreciated that the motion control unit and geometry determination unit can be embodied as dedicated electronic circuits, possibly including software code portions. The motion control unit and geometry determination unit can also be embodied as software code portions executed on, and e.g. stored in, a memory of, a programmable apparatus such as a computer, tablet or smartphone.

Although the embodiments of the invention described with reference to the drawings comprise computer apparatus and processes performed in computer apparatus, the invention also extends to computer programs, particularly computer programs on or in a carrier, adapted for putting the invention into practice. The program may be in the form of source or object code or in any other form suitable for use in the implementation of the processes according to the invention. The carrier may be any entity or device capable of carrying the program.

For example, the carrier may comprise a storage medium, such as a ROM, for example a CD ROM or a semiconductor ROM, or a magnetic recording medium, for example a floppy disc or hard disk. Further, the carrier may be a transmissible carrier such as an electrical or optical signal which may be conveyed via electrical or optical cable or by radio or other means, e.g. via the internet or cloud.

When a program is embodied in a signal which may be conveyed directly by a cable or other device or means, the carrier may be constituted by such cable or other device or means. Alternatively, the carrier may be an integrated circuit in which the program is embedded, the integrated circuit being adapted for performing, or for use in the performance of, the relevant processes.

However, other modifications, variations, and alternatives are also possible. The specifications, drawings and examples are, accordingly, to be regarded in an illustrative sense rather than in a restrictive sense.

For the purpose of clarity and a concise description features are described herein as part of the same or separate

The invention claimed is:

1. Scanning electron microscope including an electron optical imaging system and a sample carrier, wherein the sample carrier is movable between a loading position for loading a sample and an imaging position for imaging the sample,
wherein the scanning electron microscope includes a sliding vacuum seal between the electron optical imaging system and the sample carrier, wherein the sliding vacuum seal includes a first plate having a first aperture associated with the electron optical imaging system and resting against a second plate having a second aperture associated with the sample carrier, the first and second plates being slideably movable with respect to each other, the first and second apertures overlapping in the imaging position, and the first and second apertures not overlapping in the loading position,
wherein the first plate and/or the second plate includes a groove circumscribing the first and/or second aperture, wherein the groove is arranged for being in communication with a vacuum system.

2. Scanning electron microscope according to claim 1, wherein the groove is arranged to circumscribe both the first and second apertures both in the loading position and in the imaging position.

3. Scanning electron microscope according to claim 1, wherein the vacuum system is arranged for having the electron optical imaging system and the sample carrier at a first vacuum level while imaging.

4. Scanning electron microscope according to claim 3, wherein the vacuum system is arranged for having the groove at a second vacuum level, different from the first vacuum level.

5. Scanning electron microscope according to claim 4, wherein the second vacuum level is between the first vacuum level and ambient pressure.

6. Scanning electron microscope according to claim 1, wherein the electron optical imaging system includes an electron beam source and an electron detector, wherein the sample carrier is positionable between the electron beam source and the electron detector, the sample carrier being movable relative to the electron beam for moving the sample,
wherein the electron detector is movable relative to the electron beam.

7. Scanning electron microscope according to claim 1, including:
a vacuum chamber including internal structures, such as the electron optical imaging system, wherein the sample carrier is movable within the vacuum chamber,
a motion control unit including an input unit arranged for receiving user commands relating to movement of the sample carrier,
the motion control unit including a memory storing a three-dimensional model of the internal structures of the vacuum chamber and a three-dimensional model of the sample carrier, wherein the motion control unit is arranged for moving the sample carrier on the basis of the received user commands and the three-dimensional models of the internal structures and the sample carrier while avoiding collision of the sample carrier and the internal structures.

8. Scanning electron microscope according to claim 7, wherein the memory further stores a three-dimensional model of the sample carried on the sample carrier, and the motion control unit is arranged for moving the sample carrier further on the basis of the three-dimensional model of the sample.

9. Scanning electron microscope according to claim 8, further comprising an optical camera for providing an image of the sample, and a geometry determination unit for determining the three-dimensional model of the sample.

10. Scanning electron microscope according to claim 1, further comprising an electron beam source, an electron detector, and a magnetic lens, wherein the sample carrier is positioned between the electron beam source and the electron detector, and the magnetic lens is positioned between the sample carrier and the electron detector.

11. Method for loading a sample into a vacuum chamber of a scanning electron microscope including:
positioning a sample carrier in a loading position,
wherein the scanning electron microscope includes a sliding vacuum seal between an electron optical imaging system and the sample carrier, the sliding vacuum seal includes a first plate having a first aperture associated with the electron optical imaging system and resting against a second plate having a second aperture associated with the sample carrier, the first and second plates being slideably movable with respect to each other, the first and second apertures overlapping in an imaging position, and the first and second apertures not overlapping in the loading position, the first plate and/or the second plate includes a groove circumscribing the first and/or second aperture, wherein the groove is arranged for being in communication with a vacuum system;
placing the sample in the sample carrier when the sample carrier is in the loading position; and
moving the sample carrier from the loading position to the imaging position.

12. The method of claim 11, wherein the sample carrier is moved from the loading position to the imaging position by sliding the second plate of the sliding vacuum seal with respect to the first plate of the sliding vacuum seal so that the first and second apertures are overlapped.

13. The method of claim 11, further comprising passing an electron beam from the electron optical imaging system through the overlapped first and second apertures to impinge the sample in the sample carrier when the sample carrier is in the imaging position.

14. The method of claim 11, wherein moving the sample carrier from the loading position to the imaging position includes: sliding the second plate to an intermediate position after placing the sample in the sample carrier and before moving the sample carrier to the imaging position; and
evacuating the inner space of the sample carrier.

15. The method of claim 14, wherein the inner space of the sample carrier is evacuated via a connector connecting the inner space of the sample carrier and the vacuum system.

16. The method of claim 15, wherein the inner space of the sample carrier is evacuated via a connector in fluid communication with the groove.

17. The method of claim 11, further comprising providing the electron optical imaging system a first vacuum level and providing the groove a second vacuum level between the first vacuum level and ambient pressure.

18. The method of claim 11, further comprising determining a model of the sample, and the sample carrier is moved based on the model of the sample.

* * * * *